(12) United States Patent
Desai et al.

(10) Patent No.: US 9,420,732 B2
(45) Date of Patent: Aug. 16, 2016

(54) SOLAR INVERTER

(71) Applicant: SMA SOLAR TECHNOLOGY AG, Niestetal (DE)

(72) Inventors: Piyush Chandrakant Desai, Graesten (DK); Stephen Ray Larsen, Rockford, IL (US); Orges Gjini, Roscoe, IL (US); Matthew Donovan Gray, Rockford, IL (US)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 70 days.

(21) Appl. No.: 14/568,233

(22) Filed: Dec. 12, 2014

(65) Prior Publication Data

US 2015/0138729 A1   May 21, 2015

Related U.S. Application Data

(63) Continuation of application No. PCT/DK2013/000039, filed on Jun. 12, 2013.

(60) Provisional application No. 61/658,975, filed on Jun. 13, 2013.

(51) Int. Cl.
*H05K 7/20* (2006.01)
*H05K 7/14* (2006.01)
(Continued)

(52) U.S. Cl.
CPC ......... *H05K 7/20927* (2013.01); *H02M 7/003* (2013.01); *H02S 40/345* (2014.12); *H05K 7/1432* (2013.01); *H05K 7/20263* (2013.01); *H05K 7/20272* (2013.01)

(58) Field of Classification Search
CPC ......... H05K 7/20927; H05K 7/20272; H05K 7/20263; H05K 7/1432; H02M 7/003; H02S 40/345; Y02E 10/50

USPC ................................................. 361/688–723
See application file for complete search history.

(56) References Cited

U.S. PATENT DOCUMENTS

2009/0293523 A1* 12/2009 Bittner ................. F25B 25/005
62/236
2010/0134959 A1* 6/2010 Fife .................... H05K 7/20945
361/678

(Continued)

FOREIGN PATENT DOCUMENTS

WO        2010056777 A1     5/2010

OTHER PUBLICATIONS

International Search Report dated Nov. 26, 2013 for International Application No. PCT/DK2013/000039.

*Primary Examiner* — Anthony Haughton
*Assistant Examiner* — Yahya Ahmad
(74) *Attorney, Agent, or Firm* — Eschweiler & Associates, LLC

(57) ABSTRACT

A solar inverter is provided having a cooling module, a DC module, an inverter module and an AC module provided side-by-side within a chassis. The DC module includes an input accessible from a first side of the chassis and a disconnection switch on a second side of the chassis, with the input being configured to be connected to a DC solar power source. The AC module includes an output accessible from the first side of the chassis and a disconnection switch provided on the second side of the chassis. The cooling module is configured to pump a liquid coolant around the solar inverter in order to cool elements of the DC module, the inverter module and/or the AC module.

15 Claims, 4 Drawing Sheets

(51) Int. Cl.
*H02S 40/34* (2014.01)
*H02M 7/00* (2006.01)

(56) References Cited

U.S. PATENT DOCUMENTS

2010/0295383 A1* 11/2010 Cummings ....... H01L 31/02021
                                                           307/151
2012/0138123 A1* 6/2012 Newdoll .................. F24J 2/461
                                                           136/246
2012/0187768 A1* 7/2012 Goder ....................... H02J 1/10
                                                           307/82
2015/0130281 A1* 5/2015 Sabripour ................. H02J 3/32
                                                           307/66
2015/0253044 A1* 9/2015 Bittner .................. F25B 27/005
                                                           62/56

* cited by examiner

SOLAR INVERTER

REFERENCE TO RELATED APPLICATIONS

This application is a continuation of International Application number PCT/DK2013/000039, filed on Jun. 12, 2013, which claims priority to U.S. Provisional Application number 61/658,975, filed on Jun. 13, 2012.

FIELD

The present disclosure relates to an inverter circuit for converting direct current power derived from one or more photovoltaic cells or arrays into alternating current power, for example for provision to an electricity grid.

BACKGROUND

Solar inverters are well known. The standard elements are: a DC (input) module, an inverter module and an AC (output) module. The DC module includes a number of photovoltaic cells that provide a direct current (DC) input to the inverter. The inverter module uses a number of electronic switches, typically insulated gate bipolar transistors (IGBTs), to convert the DC input into an alternating current (AC) output. For inverters providing electric power to an electricity grid, the AC module provides the AC output in a format suitable for the electricity grid.

Inverter modules generate heat and usually require a cooling mechanism. For low power solar inverters, providing a cooling air flow around heat-producing elements of the inverter module is sufficient. Higher power solar inverters require more sophisticated cooling. One known solution is liquid cooling.

Liquid cooled solar inverters provide a cooling liquid to a liquid inlet of the solar inverter. The cooling liquid is directed around heat producing parts of the inverter and the liquid is heated, thereby extracting heat from the inverter circuitry. A liquid outlet of the solar inverter is used to remove the heated liquid from the solar inverter. Typically, the cooling liquid provided to solar inverters is part of a larger cooling system used for many purposes. For high power solar inverters, such a mechanism is inadequate to remove the heat generated. Moreover, the integration of such a solar inverter into a cooling system on-site is a skilled task and makes the installation and maintenance of such solar inverters expensive.

The installation and maintenance of high power solar inverters is challenging. A need exists for the provision of an integrated solution that enables high power solar inverters to be transported, installed and maintained in a cost-effective manner.

Solar inverters, particularly high power solar inverters, are often located in potentially hostile environments. Many prior art solar inverters are not capable of being operated in hostile outdoor environments.

SUMMARY

The present disclosure seeks to address at least some of the problems outlined above.

The present disclosure provides a solar inverter comprising a chassis, a cooling module, a DC module, an inverter module and an AC module. The cooling module, the DC module, the inverter module and the AC module are provided side-by-side within the chassis, and the DC module comprises an input, a disconnection switch and an output. The input of the DC module is configured to be connected to a DC solar power source and the disconnection switch of the DC module is provided on the exterior of the chassis and is provided for electrically disconnecting the input and the output of the DC module. The inverter module comprises an input coupled to the output of the DC module and an output, wherein the inverter module is configured to convert DC power at the input of the inverter module into AC power at the output of the inverter module. The AC module comprises an input coupled to the output of the inverter module, an output and a disconnection switch, wherein the disconnection switch of the AC module is provided on the exterior of the chassis and on the same side of the chassis as the disconnection switch of the DC module. The disconnection switch for the AC module is provided for electrically disconnecting the output of the inverter module and the output of the AC module, and the cooling module is configured to pump a fluid coolant around the solar inverter in order to cool one or more elements of the DC module, the inverter module and/or the AC module.

In one embodiment the disconnection switches of the AC and DC modules are provided to the exterior of the chassis, thereby providing mechanisms for electrically disconnecting parts of the solar inverter that are entirely under the control of an operator, without that operator needing to access the interior of the chassis. This provides ease of use and also aids safety and security.

In one embodiment of the disclosure, the inverter module is positioned horizontally side-by-side the DC module and the AC module.

The cooling module may be positioned horizontally side-by-side the DC module. Alternatively, the cooling module may be positioned horizontally side-by-side the AC module.

In one embodiment the input of the DC module and the output of the AC module may be positioned within the chassis. DC connecting rods may be provided to connect the input of the DC module to one or more solar cells. The DC connecting rods may extend through a hole in the chassis. Similarly, AC connecting rods may be provided to connect the output of the AC module to the electricity grid. The AC connecting rods may extend through a hold in the chassis.

In various embodiments of the disclosure, the input of the DC module and the output of the AC module are accessible from a first side of the chassis, wherein the first side of the chassis is opposite to the side on which the disconnection switches of the DC and AC modules are provided.

In one embodiment, one or more of the cooling module, the DC module, the inverter module and the AC module may be configured to be assembled prior to being included in said chassis.

In various embodiments of the disclosure, the cooling module, the DC module, the inverter module and the AC module are enclosed within the chassis. Providing an enclosed (or at least partially enclosed) chassis may provide safety and security and can also improve performance, particularly in hostile environments. Doors may be provided to enable access (typically restricted access) to the interior of the chassis.

In one embodiment the DC module may include a DC contactor configured to selectively electrically connect the DC solar power source and the output of the DC module. The DC contactor may be under the control of a control circuit of the solar inverter. Thus, two separate mechanisms may be provided for electrically connecting and disconnecting the DC input from the DC solar power source, with one mechanism (the disconnection switch of the DC module) being under the control of an operator and the other mechanism (the DC contactor) under the control of a control circuit of the solar inverter.

A plurality of fuses may be provided for selectively coupling a plurality of DC solar power sources to the DC module according to one embodiment.

In one embodiment the AC module may include an AC contactor configured to selectively electrically connect the output of the inverter module and the output of the AC module. The AC contactor may be under the control of a control circuit of the solar inverter. Thus, two separate mechanisms may be provided for electrically connecting and disconnecting the output of the inverter module and the output of the AC module, with one mechanism (the disconnection switch of the AC module) being under the control of an operator and the other mechanism (the DC contactor) under the control of a control circuit of the solar inverter.

In one embodiment the cooling module may comprise a fluid reservoir, a pump, a heat exchanger, an inlet and an outlet, wherein the pump is used to direct the fluid coolant from the reservoir to the outlet of the cooling module from where the fluid coolant is used to cool elements of the solar inverter before the fluid coolant is returned to the inlet of the cooling module. The fluid coolant received at the inlet of the cooling module is directed to the heat exchanger in order for at least some of the heat extracted from the solar inverter to be removed from the fluid coolant.

The fluid coolant is often a liquid coolant. The liquid coolant may be air cooled. For example, after having passed the one or more elements to be cooled, the liquid coolant may be directed to a heat exchanger in which the liquid coolant is air cooled.

In some embodiments of the disclosure, there is provided a means for directing the liquid coolant towards one or more heat generating parts of the solar inverter in order to remove heat therefrom. This is a particularly efficient mechanism for removing heat from an object to be cooled. In some embodiments of the disclosure, heat exchange between the liquid coolant and at least some of the one or more elements of the DC module, the inverter module and/or the AC module is performed in micro-channel heat exchangers.

BRIEF DESCRIPTION OF THE DRAWINGS

The disclosure will now be described in further detail with reference to the following schematic drawings, in which.

DETAILED DESCRIPTION

Figure 1:
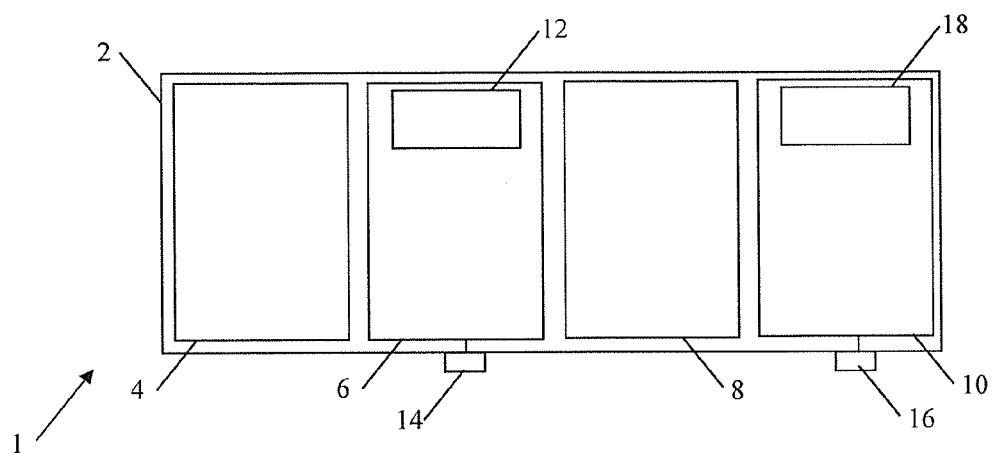
FIG. 1 is a highly schematic plan view of a solar inverter in accordance with an aspect of the present disclosure.

FIG. 1 is highly schematic plan view of a solar inverter, indicated generally by the reference numeral 1, in accordance with an aspect of the present disclosure.

The solar inverter 1 comprises a chassis 2, a cooling module 4, a DC module 6, an inverter module 8 and an AC module 10. The DC module 6 has an output coupled to an input of the inverter module 8. The inverter module 8 has an output coupled to an input of the AC module 10. The cooling module 4, DC module 6, inverter module 8 and AC module are provided side-by-side within the chassis 2.

The DC module 6 includes a DC input connector 12 and a DC disconnect switch 14. The DC input connector 12 is typically mounted within the chassis 2 and is provided for connection to a number of photovoltaic cells or arrays. The DC disconnect switch 14 is mounted on the exterior of the chassis, which enables an operator of the inverter 1 to operate a physical switch that disconnects the DC module 6 from the inverter 8.

Similarly, the AC module includes an AC disconnect switch 16 and an AC output connector 18. The AC output connector 18 is typically mounted within the chassis 2 and is provided for connection to an electricity grid. The AC disconnect switch 16 is mounted on the exterior of the chassis, which enables an operator of the inverter 1 to operate a physical switch that disconnects the generated AC output from the electricity grid. As shown in the embodiment of FIG. 1, the AC disconnect switch 16 is mounted on the same side of the chassis 2 as the DC disconnect switch 14.

Figure 2:
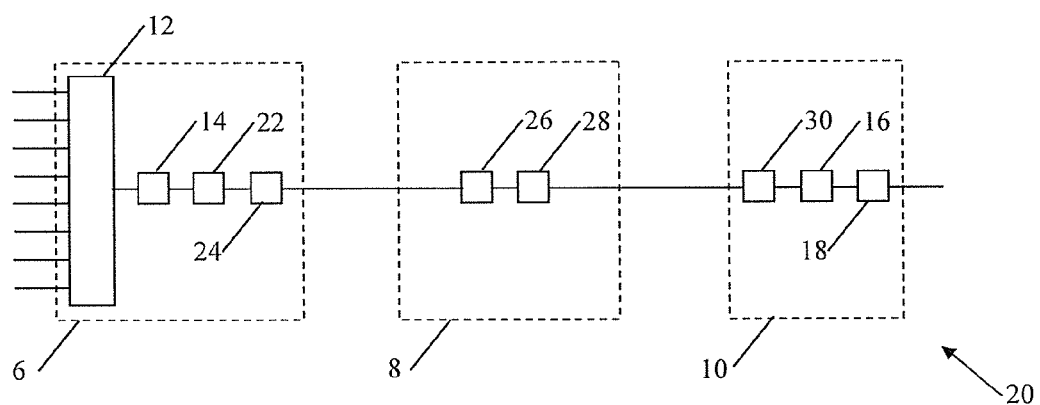
FIG. 2 is a highly schematic electric circuit diagram of a solar inverter in accordance with an aspect of the present disclosure.

FIG. 2 is a highly schematic electric circuit diagram, indicated generally by the reference numeral 20, of the solar inverter 1. The circuit diagram 20 comprises the DC module 6, the inverter module 8 and the AC module 10. As described above, the DC module 6 has an output coupled to the input of the inverter module 8 and the inverter module 8 has an output coupled to the input of the AC module 10.

As shown in FIG. 2, the DC module 6 comprises the DC input connector 12, the DC disconnect switch 14, a DC contactor 22 and a filter 24. The DC input connector 12 is configured to be connected to a plurality of photovoltaic cells or arrays. The DC input connector 12 may include a number of fuses (e.g. a fuse provided for each photovoltaic input to the inverter 1). The DC input connector 12 takes the multiple DC inputs and provides a single DC input to the DC disconnect switch 14.

The DC disconnect switch 14 and the DC contactor 22 provide two different mechanisms for connecting or disconnecting the DC input from the photovoltaic cells/arrays to/from the input of the inverter module 8. As described above, the DC disconnect switch 14 is a physical switch provided on the exterior of the chassis 2. The DC disconnect switch 14 therefore provides a mechanism that is entirely under the operator's control for reliably disconnecting the DC input from the inverter module 8, without requiring access to the interior of the chassis 2. The DC contactor 22 is under the control of a control circuit (not shown) for the inverter 1. The DC contactor 22 is typically a relay having a magnetic coil that, when energized, makes a contact.

The inverter module 8 comprises a DC/AC module 26 and a filter 28. The DC/AC module 26 converts a DC input obtained from the photovoltaic cells/arrays and provides an AC output that will ultimately be provided as an output, for example to an electricity grid. The DC/AC module 26 comprises a number of electric switches (e.g. IGBTs) in a manner well known in the art. The filter 28 can take many forms and typically includes one or more capacitors and inductors and is used, for example, to filter switching noise. The skilled person will be aware of many suitable filter configurations.

The AC module 10 comprises an AC connector 30, the AC disconnect switch 16 and the AC output connector 18. In a similar manner to the DC module 6, the AC module 8 provides two mechanisms (the AC contactor 30 and the AC disconnect switch 16) for connecting or disconnecting the output of the inverter module 8 to/from the AC output connector 18. The AC disconnect switch 16 is a physical switch provided on the exterior of the chassis 2 that provides a mechanism that is entirely under the operator's control for reliably disconnecting the output of the inverter module from the AC output connector, without requiring access to the interior of the chassis 2. The AC contactor 30 is under the control of a control circuit (not shown) for the inverter 1 and is typically a relay having a magnetic coil that, when energized, makes a contact.

In the normal use of the inverter 1, the DC disconnect switch 14 and the AC disconnect switch 16 will both be closed. Whether or not the DC inputs are connected to the input of the inverter module 8 is therefore dependent on the state of the DC contactor 22, which is under the control of the control circuit of the inverter 1. Similarly, whether or not the output of the inverter module 8 is connected to the AC output is under the control of the AC contactor 30. When an operator wants to ensure that the inverter 1 is isolated (for example for maintenance purposes), the DC disconnect switch 14 and the AC disconnect switch 16 can both be opened.

Figure 3:
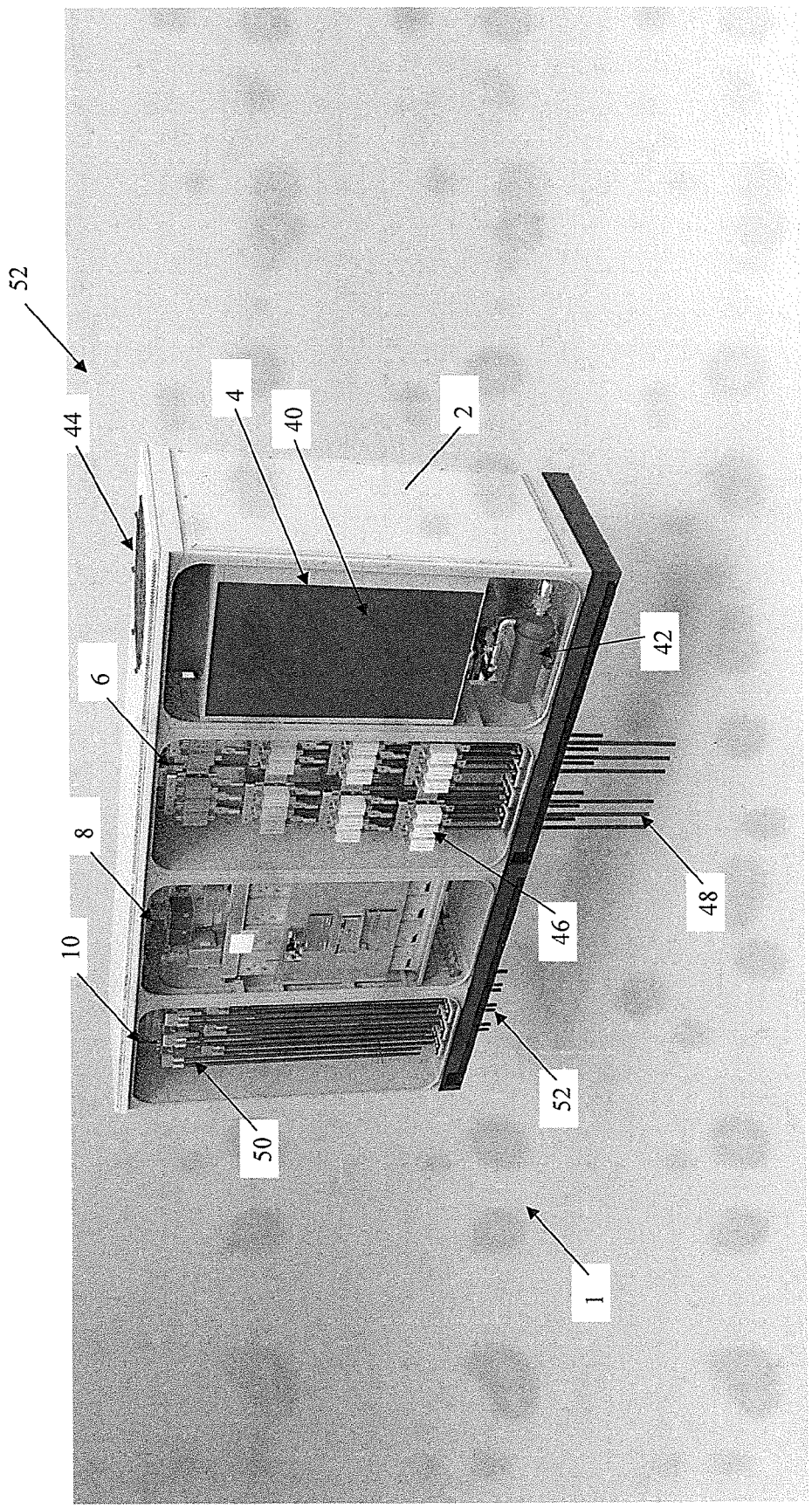
FIG. 3 shows an example solar inverter in accordance with an aspect of the present disclosure.

FIG. 3 is an image of the rear of an example inverter 1 in accordance with an aspect of the present disclosure. The inverter 1 is shown without door panels so that the interior of the inverter is visible. Doors are typically provided for safety and security and may be locked to prevent access to the interior of the chassis to unauthorized personnel. Doors may also be provided to improve performance, especially in hostile environments, such as dusty or damp environments.

As described above, the inverter 1 comprises a chassis 2 having a cooling module 4, a DC module 6, an inverter module 8 and an AC module 10 mounted therein.

The cooling module 4 includes a tank (or reservoir) 40 in which liquid coolant (e.g., water) is stored, a pump 42 used for pumping the liquid coolant around the inverter 1 and a fan 44. The fan is used to move air through the cooling module 4 in order to remove heat from the liquid coolant. The cooling module is therefore provided within the chassis and is easily accessible, for example for maintenance purposes. Providing the cooling module alongside the other modules of the inverter also simplifies transportation and assembly.

The DC module 6 includes a plurality of connectors 46 that together form the DC input connector 22. Each of the connectors 46 includes a fuse that can be used to separate a photovoltaic cell or array from the inverter module 8. The connectors 46 are connected via rods 48 that pass through a gap in the bottom of the chassis 2 to photovoltaic cells or arrays.

The AC module 10 includes a plurality of AC connectors 50 that together form the AC output connector 18. The connectors 50 are connected via rods 52 that pass through a gap in the bottom of the inverter 1 to the electricity grid.

Figure 4:
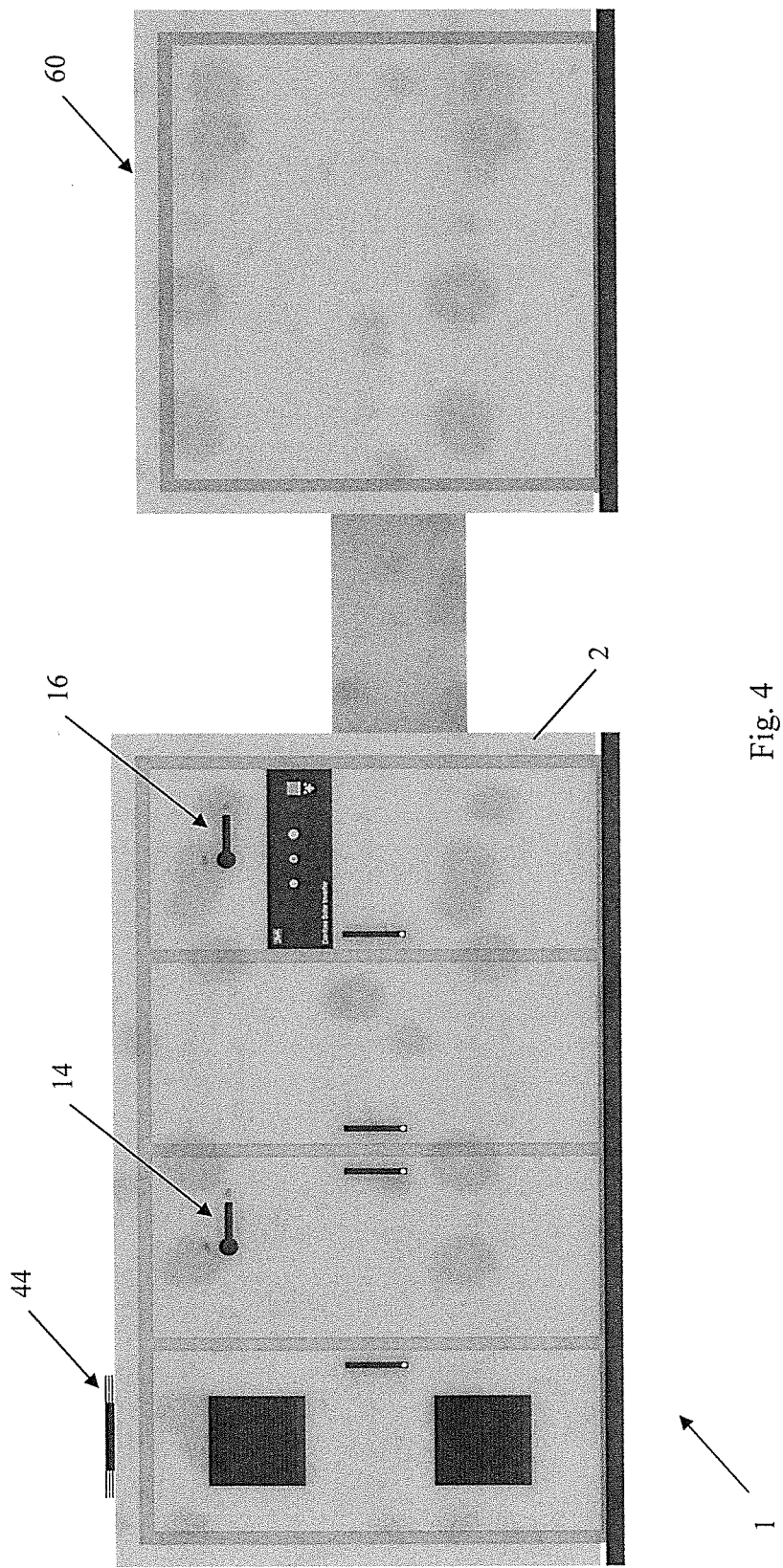
FIG. 4 shows an example solar inverter in accordance with an aspect of the present disclosure.

FIG. 4 is an image of the front of an exemplary inverter 1 in accordance with an aspect of the present disclosure. Unlike the inverter shown in FIG. 3, the inverter 1 shown in FIG. 4 includes door panels so that the interior of the inverter is not visible. The inverter 1 comprises the chassis 2 in which the cooling module 4, the DC module 6, the inverter module 8 and the AC module 10 are mounted. The cooling module 4 is at the left hand side of the inverter 1 shown in FIG. 1 (the fan 44 of the cooling module is visible).

FIG. 4 shows the inverter 1 connected to a transformer 60. The transformer 60 may be provided to connect the output of the AC module 10 to the electricity grid.

Also visible in FIG. 4 are the DC disconnect switch 14 and the AC disconnect switch 16. The disconnect switches are provided on the exterior doors so that, in the use of the inverter 1, the operator can disconnect the DC module from the input of the inverter module and/or can disconnect the AC module from the output of the inverter module. Thus, as noted above, no access to the interior of the chassis 2 is required in order to operate the switches 14 and 16.

In one embodiment of the disclosure, one or more of the cooling module 4, the DC module 6, the inverter module 8 and the AC module 10 are configured to be completely, or almost completely, assembled before the module is inserted into the chassis. This simplifies the installation of the inverter 1 at a customer site. This modular approach also enables one or more of the cooling module, the DC module, the inverter module and the AC module to be delivered separately to the chassis 2. This simplifies the transportation and delivery of the inverter 1. Furthermore, the provision of doors on the chassis provides safety and security during the use of the inverter, but also provides easy access to each of the modules for maintenance or inspection.

As described above, the cooling module 4 may provide liquid coolant for removing heat from heat generating parts of the inverter 1. The cooling module 4 may take many different forms.

Figure 5:
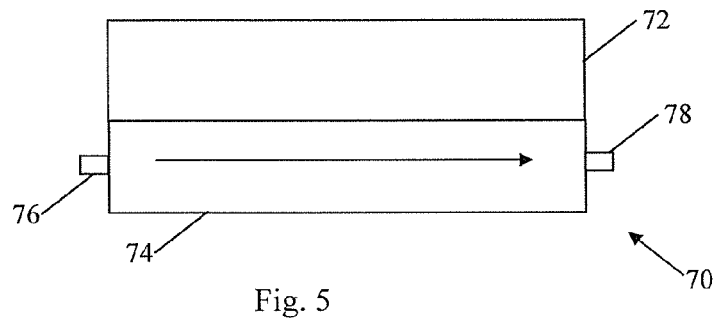
FIG. 5 shows a system demonstrating one cooling methodology that may be used in the present disclosure.

FIG. 5 is a system, indicated generally by the reference numeral 70, demonstrating one cooling methodology that may be implemented in the inverter 1. The system 50 comprises an object to be cooled 72 and a cooling channel 74. The cooling channel 74 has an inlet 76 and an outlet 78. Cooling liquid passes through the cooling channel 74 from the inlet 76 to the outlet 78. The cooling liquid is heated by the object to be cooled 72, thereby removing heat from the object to be cooled. In the inverter 1, liquid from the cooling module 4 can be pumped around the inverter in a cooling channel, with the cooling channel passing heat generating parts of the inverter 1 (such as the switches of the inverter module).

Figure 6:
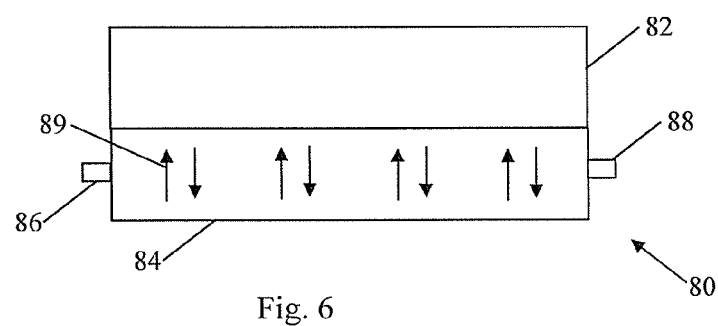
FIG. 6 shows a system demonstrating an alternative cooling methodology that may be used in the present disclosure.

FIG. 6 is a system, indicated generally by the reference numeral 80, demonstrating an alternative cooling methodology that may be implemented in the inverter 1. The system 80 comprises an object to be cooled 82 and a cooling channel 84. The cooling channel 84 has an inlet 86 and an outlet 88. Cooling liquid enters the cooling channel at the inlet 86 and exits the cooling channel at the outlet 88. Inside the cooling channel, the cooling liquid is directed towards the object to be cooled, as indicated by the arrows 89. The directing of cooling liquid towards the object to be cooled may be achieved using the cooling mechanism 90 shown in FIG. 7.

Figure 7:
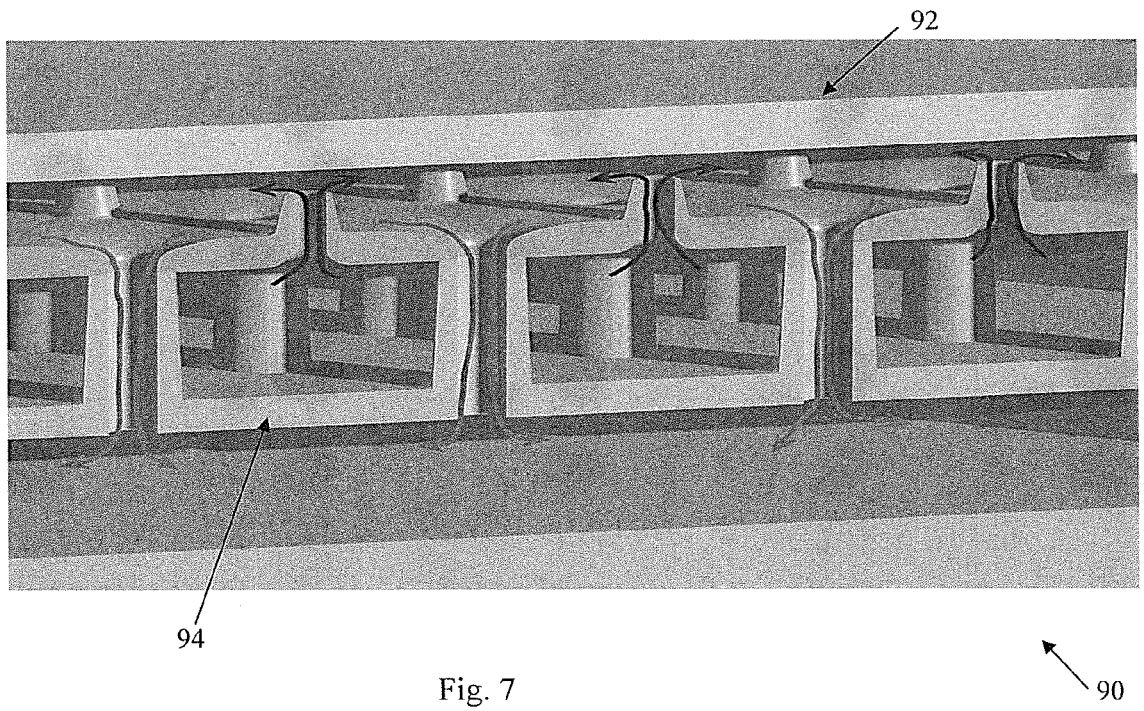
FIG. 7 shows an example implementation of the cooling methodology shown in FIG. 6.

The cooling mechanism 90 shown in FIG. 7 includes an example surface to be cooled 92 and a cooling channel consisting of a number of cells 94. As shown in FIG. 7, cooling liquid is forced out of the top of the cells 94 and into contact with the surface 92. The liquid then exits the module around the outside of the cells 94.

Thus, in the inverter 1, liquid from the cooling module 4 can be directed around the inverter in a cooling channel, with the cooling channel being configured to direct the cooling liquid into contact with the heat generating parts of the inverter.

The example implementation shown in FIG. 7 is, of course, one of many possible implementations of the direct liquid cooling system 80. The skilled person will be aware of many alternatives that could be used in accordance with the principles of the present disclosure.

The embodiments of the disclosure described above are provided by way of example only. The skilled person will be aware of many modifications, changes and substitutions that could be made without departing from the scope of the present disclosure. The claims of the present disclosure are intended to cover all such modifications, changes and substitutions as fall within the spirit and scope of the disclosure.

The invention claimed is:

1. A solar inverter comprising a chassis, a cooling module, a DC module, an inverter module and an AC module, wherein:
   the cooling module, the DC module, the inverter module and the AC module are provided side-by-side within the chassis;
   the DC module comprises an input, a disconnection switch and an output, wherein the input of the DC module is configured to be connected to a DC solar power source and wherein the disconnection switch of the DC module is provided on an exterior of the chassis and is configured to electrically disconnect the input and the output of the DC module;
   the inverter module comprises an input coupled to the output of the DC module and an output, wherein the inverter module is configured to convert DC power at the input of the inverter module into AC power at the output of the inverter module;
   the AC module comprises an input coupled to the output of the inverter module, an output and a disconnection switch, wherein the disconnection switch of the AC module is provided on the exterior of the chassis and on a same side of the chassis as the disconnection switch of the DC module, and wherein the disconnection switch for the AC module is configured to electrically disconnect the output of the inverter module and the output of the AC module; and
   the cooling module is configured to pump a fluid coolant around the solar inverter in order to cool one or more elements of the DC module, the inverter module and/or the AC module.

2. A solar inverter as claimed in claim 1, wherein the inverter module is positioned horizontally side-by-side the DC module and the AC module.

3. A solar inverter as claimed in claim 1, wherein the cooling module is positioned horizontally side-by-side the DC module.

4. A solar inverter as claimed in claim 1, wherein the cooling module is positioned horizontally side-by-side the AC module.

5. A solar inverter as claimed in claim 1, wherein the input of the DC module and the output of the AC module are positioned within the chassis.

6. A solar inverter as claimed in claim 1, wherein the input of the DC module and the output of the AC module are accessible from a first side of the chassis, wherein the first side of the chassis is opposite to the side on which the disconnection switches of the DC and AC modules are provided.

7. A solar inverter as claimed in claim 1, wherein one or more of the cooling module, the DC module, the inverter module and the AC module is/are configured to be assembled prior to being included in said chassis.

8. A solar inverter as claimed in claim 1, wherein the cooling module, the DC module, the inverter module and the AC module are enclosed within the chassis.

9. A solar inverter as claimed in claim 1, wherein the DC module further comprises a DC contactor configured to selectively electrically connect the DC solar power source and the output of the DC module.

10. A solar inverter as claimed in claim 1, further comprising a plurality of fuses configured to couple a plurality of DC solar power sources to the DC module.

11. A solar inverter as claimed in claim 1, wherein the AC module further comprises an AC contactor configured to selectively electrically connect the output of the inverter module and the output of the AC module.

12. A solar inverter as claimed in claim 1, wherein the cooling module comprises a fluid reservoir, a pump, a heat exchanger, an inlet and an outlet, wherein the pump is used to direct the fluid coolant from the reservoir to the outlet of the cooling module from where the fluid coolant is used to cool elements of the solar inverter before the fluid coolant is returned to the inlet of the cooling module, and wherein fluid coolant received at the inlet of the cooling module is directed to the heat exchanger in order for at least some of the heat extracted from the solar inverter to be removed from the fluid coolant.

13. A solar inverter as claimed in claim 1, wherein the fluid coolant is a liquid coolant, and wherein the liquid coolant, after having passed the one or more elements to be cooled, is directed to a heat exchanger in which the liquid coolant is air cooled.

14. A solar inverter as claimed in claim 1, further comprising means for directing the liquid coolant towards one or more heat generating parts of the solar inverter in order to remove heat therefrom.

15. A solar inverter according to claim 1, where heat exchange between the liquid coolant and at least some of the one or more elements of the DC module, the inverter module and/or the AC module is performed in micro-channel heat exchangers.

* * * * *